US006562715B1

United States Patent
Chen et al.

(10) Patent No.: US 6,562,715 B1
(45) Date of Patent: May 13, 2003

(54) BARRIER LAYER STRUCTURE FOR COPPER METALLIZATION AND METHOD OF FORMING THE STRUCTURE

(75) Inventors: Ling Chen, Sunnyvale, CA (US); Christophe Marcadal, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 144 days.

(21) Appl. No.: 09/635,738

(22) Filed: Aug. 9, 2000

(51) Int. Cl.$^7$ .............................................. C23C 14/18
(52) U.S. Cl. ...................... 438/643; 438/653; 438/679; 438/680; 438/685; 438/687; 427/97; 427/250; 427/255.394; 427/255.395; 427/255.7; 427/305; 204/192.17; 205/157; 205/184; 205/186; 205/187
(58) Field of Search .................. 427/97, 250, 255.394, 427/255.395, 255.7, 305; 204/192.17; 205/157, 184, 186, 187; 438/643, 653, 679, 680, 685, 687

(56) References Cited

U.S. PATENT DOCUMENTS

| 3,607,384 A | 9/1971 | Banks | 117/215 |
|---|---|---|---|
| 4,169,032 A | 9/1979 | Haase et al. | 204/192 F |
| 4,364,099 A | 12/1982 | Koyama et al. | 361/305 |
| 4,491,509 A | 1/1985 | Krause | 204/192 R |
| 4,760,369 A | 7/1988 | Tiku | 338/308 |
| 4,782,380 A | 11/1988 | Shankar et al. | 357/71 |
| 4,951,601 A | 8/1990 | Maydan et al. | 118/719 |
| 4,962,060 A | 10/1990 | Sliwa et al. | 437/192 |
| 4,999,096 A | 3/1991 | Nihei et al. | 204/192.3 |
| 5,178,739 A | 1/1993 | Barnes et al. | 204/192.12 |
| 5,186,718 A | 2/1993 | Tepman et al. | 29/25.01 |
| 5,308,793 A | 5/1994 | Taguchi et al. | 437/194 |
| 5,354,712 A | 10/1994 | Ho et al. | 437/195 |

(List continued on next page.)

FOREIGN PATENT DOCUMENTS

| EP | 0 818 817 | 1/1998 | ......... H01L/21/768 |
|---|---|---|---|
| JP | 05-179437 | 7/1993 | ........... C23C/14/34 |
| JP | 09-186157 | 7/1997 | ....... H01L/21/3205 |
| JP | 10-041389 | 2/1998 | ......... H01L/21/768 |
| WO | WO 98/52219 | 11/1998 | ......... H01L/21/768 |
| WO | WO 98/54377 | 12/1998 | ........... C23C/14/14 |
| WO | WO 00/38225 | 6/2000 | ....... H01L/21/3105 |
| WO | WO 00/41235 | 7/2000 | ......... H01L/21/768 |

OTHER PUBLICATIONS

USSN Ser. No.: 09/635,738, Chen, et al., "Barrier Layer Structure for Copper Metallization and Method of Forming the Structure, " Filed: Aug. 9, 2000.

R.F. Bunshah, "Handbook of Deposition Technologies for Films and Coatings", $2^{nd}$ edition, Noyas Publications, NJ, USA, 1994, 261, 321–325.

Gardner et al., "Encapsulated Copper Interconnection Device using Sidewall Barriers", Thin Solid Films 262 (1995) 104–119.

(List continued on next page.)

Primary Examiner—Timothy Meeks
(74) Attorney, Agent, or Firm—Moser, Patterson & Sheridan

(57) ABSTRACT

A barrier layer structure and a method of forming the structure. The barrier layer structure comprises a bilayer, with a first layer formed by chemical vapor deposition and a second layer formed by physical vapor deposition. The first barrier layer comprises a metal or a metal nitride and the second barrier layer comprises a metal or a metal nitride. The barrier bilayer is applicable to copper metallization.

8 Claims, 8 Drawing Sheets

U.S. PATENT DOCUMENTS

| | | | |
|---|---|---|---|
| 5,371,042 A | 12/1994 | Ong | 437/194 |
| 5,486,492 A | 1/1996 | Yamamoto et al. | 437/192 |
| 5,534,460 A | 7/1996 | Tseng et al. | 437/187 |
| 5,565,029 A | 10/1996 | Takasu | 117/1 |
| 5,613,296 A | 3/1997 | Kurino et al. | 29/852 |
| 5,654,232 A | 8/1997 | Gardner | 438/661 |
| 5,674,787 A | 10/1997 | Zhao et al. | 437/230 |
| 5,846,332 A | 12/1998 | Zhao et al. | 118/728 |
| 5,910,880 A | 6/1999 | DeBoer et al. | 361/311 |
| 5,930,669 A | 7/1999 | Uzoh | 438/627 |
| 5,933,753 A | 8/1999 | Simon et al. | 438/629 |
| 5,972,178 A | 10/1999 | Narasimhan et al. | 204/192.17 |
| 5,972,179 A | 10/1999 | Chittipeddi et al. | 204/192.17 |
| 5,985,762 A | 11/1999 | Geffken et al. | 438/687 |
| 5,989,999 A | 11/1999 | Levine et al. | 438/627 |
| 5,993,916 A | 11/1999 | Zhao et al. | 427/535 |
| 6,002,174 A | 12/1999 | Akram et al. | 257/751 |
| 6,007,684 A | 12/1999 | Fu et al. | 204/192.17 |
| 6,013,576 A | 1/2000 | Oh et al. | 438/648 |
| 6,017,817 A | 1/2000 | Chung et al. | 438/637 |
| 6,023,102 A | 2/2000 | Nguyen et al. | 257/774 |
| 6,028,003 A | 2/2000 | Frisa et al. | 438/653 |
| 6,054,382 A * | 4/2000 | Hsu et al. | 438/628 |
| 6,143,646 A | 11/2000 | Wetzel | 438/637 |
| 6,146,517 A * | 11/2000 | Hoinkis | 205/123 |
| 6,157,061 A | 12/2000 | Kawata | 257/316 |
| 6,157,081 A | 12/2000 | Nariman et al. | 257/752 |
| 6,164,128 A | 12/2000 | Santa Cruz et al. | 73/170.11 |
| 6,164,138 A | 12/2000 | Blake et al. | 73/732 |
| 6,166,423 A | 12/2000 | Gambino et al. | 257/532 |
| 6,184,128 B1 | 2/2001 | Wang et al. | 438/637 |
| 6,184,138 B1 | 2/2001 | Ho et al. | 438/687 |
| 6,200,433 B1 | 3/2001 | Ding et al. | 204/192.15 |
| 6,211,071 B1 | 4/2001 | Lukanc et al. | 438/640 |
| 6,221,775 B1 | 4/2001 | Ference et al. | 438/691 |
| 6,229,174 B1 | 5/2001 | Parekh | 257/306 |
| 6,265,757 B1 | 7/2001 | Brady et al. | 257/623 |
| 6,268,283 B1 | 7/2001 | Huang | 438/638 |
| 6,271,084 B1 | 8/2001 | Tu et al. | 438/253 |
| 6,271,592 B1 | 8/2001 | Kim et al. | 257/751 |
| 6,274,483 B1 | 8/2001 | Chang et al. | 438/640 |
| 6,309,801 B1 | 10/2001 | Meijer et al. | 430/313 |

OTHER PUBLICATIONS

Jang et al., "Tantalum and Niobium as a Diffusion Barrier between Copper and Silicon", J. Materials Science: Materials in Electronics 7 (1996) 271–278.

Electromigration and Diffusion in Pure Cu and Cu(Sn) Alloys. C. K. Hu, K. L. Lee, D. Gupta, and P. Blauner, Mat. Res. Soc. Symp. vol. 427 (96–105).

Electromigration Failure Distributions for Multi–Large Interconnects as a Function of Line Width Experiments and Simulation, D.D. Brown, J.E. Sanchez, Jr., V. Pham, P.R. Besser, M.A. Korhonen, and C.Y. Li, Mat Res. Soc. Symp. vol. 427.

Tadashi Iijima, Yoshiakai Shimooka, and Kyoichi Suguro, "An Amorphous Ti–Si–N Diffusion Barrier Layer for Cu Interconnections," vol. 78, No. 12, 1995, pp. 67–74.

Mikagi H. Ishikawa, T. Usami, M. Suzuki, K. Inoue, N. Oda, S. Chikaki, I. Sakai and T. Kikkawa. Barrier Metal Free Copper Damascene Interconnection Technology Using Atmospheric Copper Reflow and Nitrogen Doping in SiOF Film. 1996 IEEE. pp. 365–368.

Y. Shacham–Diamand. V. Dubin, and M. Angyal "Electroless Copper Deposition for ULSI" 1995 Elsevier Science S.A., pp. 93–103.

K. Min et al., "Comparative Study of Tantalum and Tantalum Nitride as a Diffusion Barrier for CU Metallization" J. Vac. Sc. Technol. B 14(5), Sep./Oct. 1996, p 1–7.

International Search Report for PCT/US01/26751, dated May 27, 2002.

International Search Report for PCT/US01/24880, dated May 17, 2002.

International Search Report for PCT/US98/09751, dated Sep. 16, 1998.

* cited by examiner

1 X 50 TiN

1 X 50 TiN / 50Å Ta

BARRIER LAYER STRUCTURE FOR COPPER METALLIZATION AND METHOD OF FORMING THE STRUCTURE

BACKGROUND OF THE DISCLOSURE

1. Field of the Invention

The invention relates to a barrier layer structure and method of forming the structure for copper metallization.

2. Background of the Invention

Refractory metals and their nitrides have been used extensively as liner/barrier layers in aluminum metallization technology. For example, titanium and titanium nitride (Ti/TiN) are often used to improve adhesion and to minimize aluminum diffusion to underlying layers. However, in advanced integrated circuit fabrication, copper (Cu) and its alloys are increasingly being used for metal interconnects because they have lower resistivities and better electromigration characteristics than aluminum.

In forming copper metal interconnects in contact or via structures, a TiN barrier layer may be deposited by chemical vapor deposition (CVD) to provide conformal step coverage over the contact or via. A Cu layer is then formed on the TiN barrier, filling the contact or via. Thereafter, a planarization technique such as chemical mechanical polishing may be used to remove the Cu/TiN stack lying outside the contact or via, resulting in the formation of a planarized structure, which comprises a Cu plug inside the contact or via. In general, the Cu layer may be formed by electroplating, CVD or physical vapor deposition (PVD). In the case of electroplating, a relatively thin Cu seed layer is usually formed on the TiN barrier layer, in order to facilitate subsequent Cu electroplating.

Although CVD TiN provides conformal step coverage, PVD Ta and TaN are used as barrier materials in current Cu metallization technology, because a copper layer formed on a PVD Ta or TaN surface exhibits a good (111) orientation, which is desirable because it provides better resistance to electromigration and improved lifetime. Despite limited step coverage, the performance of PVD Ta or TaN as barrier layers is sufficient for current applications. For future applications, however, a CVD barrier layer is necessary to provide conformal step coverage. Thus, there is an ongoing need to form improved barrier layers suitable for future generations of Cu metallization.

SUMMARY OF THE INVENTION

The present invention relates to a barrier layer structure and a method of forming the structure for metallization. Embodiments of the invention provide a method of forming a first barrier layer using chemical vapor deposition, forming a second barrier layer using physical vapor deposition, and forming at least one copper layer on the second barrier layer.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The invention relates to a barrier layer structure and a method of forming the structure for metallization. The inventors recognized that future copper (Cu) metallization applications require the use of a barrier layer with conformal step coverage, such as that provided by chemical vapor deposition (CVD), to prevent Cu diffusion at the sidewalls of contacts, vias or trenches. However, the inventors also recognized that a Cu layer deposited on a CVD TiN barrier layer does not have the strong (111) crystal orientation necessary for improved electromigration characteristics.

Thus, according to embodiments of the invention, the barrier layer structure comprises a bilayer, with a first barrier layer formed by chemical vapor deposition (CVD) and a second barrier layer formed by physical vapor deposition (PVD). The first barrier layer typically comprises a metal or metal nitride, e.g., tungsten (W), titanium (Ti), tantalum (Ta), tungsten nitride (WN), titanium nitride (TiN), tantalum nitride (TaN), or a ternary nitride such as titanium silicon nitride (TiSiN), among others. The second barrier layer comprises a metal or its nitride, for example, refractory metals or nitrides such as Ta, TaN, W, WN, Ti or TiN, or a ternary nitride. The CVD barrier layer provides sidewall barrier protection while the PVD barrier layer provides a good interface for subsequent copper deposition, and further enhances (111) orientation of the Cu layer for improved resistance against electromigration.

Apparatus

The process of the present invention can be performed in either a single multi-chamber or integrated processing system (e.g., a cluster tool) having both PVD and CVD chambers, or separate processing systems. The use of an integrated processing system is preferred because the substrate can be kept within a vacuum environment to prevent contamination between processing steps. Examples of integrated processing systems include, ENDURA® and CENTURA® platforms used in conjunction with processing chambers such as a VECTRA IMP™, SIP™, Coherent and Standard PVD chamber, or a TxZ™ CVD chamber, among others. These integrated processing systems and chambers are commercially available from Applied Materials, Inc., located in Santa Clara, Calif.

Figure 1:
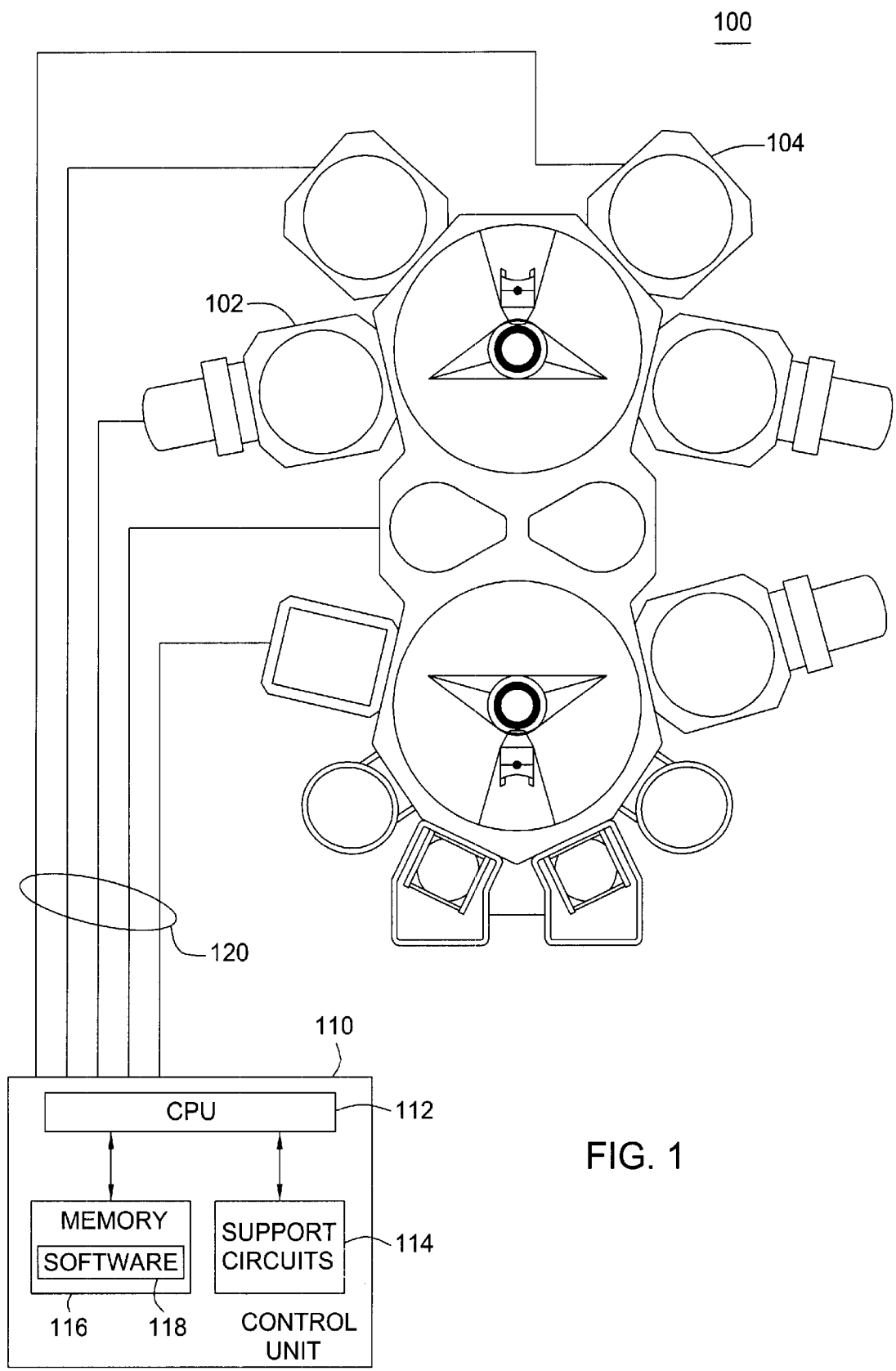
FIG. 1 illustrates an integrated processing system suitable for practicing embodiments of the invention.

FIG. 1 depicts a schematic representation of an integrated processing system 100, e.g., an ENDURA system, suitable for practicing embodiments of the invention. A similar staged-vacuum wafer processing system is disclosed in U.S. Pat. No. 5,186,718, entitled "Staged-Vacuum Wafer Processing System and Method," issued to Tepman et al. on Feb. 16, 1993, which is incorporated herein by reference. The particular embodiment of the system 100 shown herein is suitable for processing planar substrates, such as semiconductor substrates, and is provided to illustrate embodiments of the invention, and should not be used to limit the scope of any aspects of the invention. The system 100 typically comprises a cluster of interconnected process chambers, for example, a CVD chamber 102 and a PVD chamber 104.

The processes of the present invention can be implemented using a computer program product or microprocessor controller that executes on a conventional computer system. As illustrated in FIG. 1, a control unit 110 comprises a central processor unit (CPU) 112, support circuitry 114, and memories 116 containing associated control software 118. The control unit 112 is used for automated control of the numerous steps required for wafer processing—such as wafer transport, gas flow control, temperature control, chamber evacuation, and so on. Bi-directional communications between the control unit 112 and various components of the integrated processing system 100 are handled through numerous signal cables collectively referred to as signal buses 120, some of which are illustrated in FIG. 1.

PVD Chambers

Figure 2:
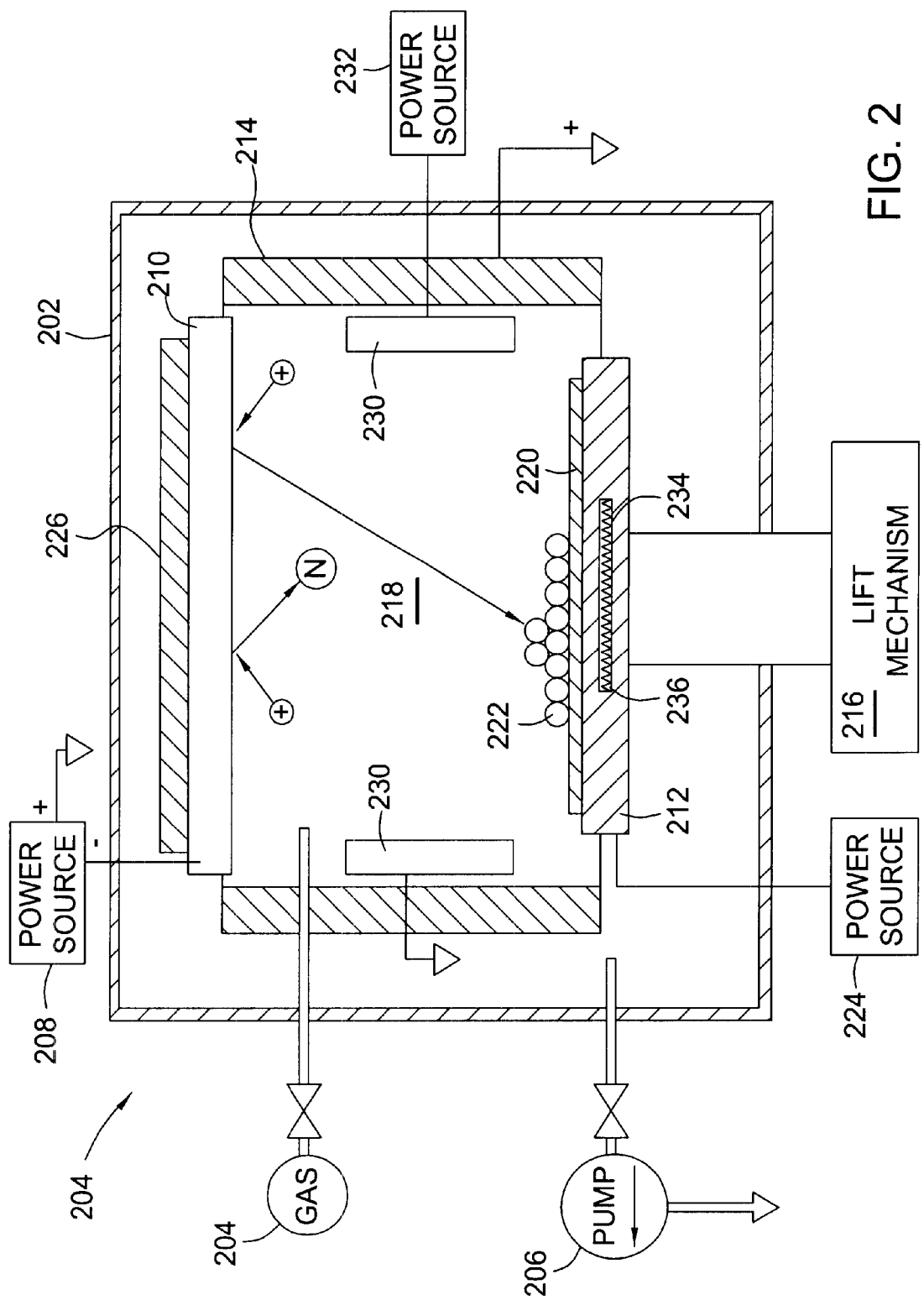
FIG. 2 is a schematic representation of a physical vapor deposition chamber suitable for practicing embodiments of the invention.

FIG. 2 illustrates a cross-sectional view of an example of a PVD chamber 104 that is suitable for practicing the embodiments of the invention. The PVD chamber 104 comprises a vacuum chamber 202, a gas source 204, a pumping system 206 and a target power source 208. Inside the vacuum chamber 202 is a target 210, a vertically movable pedestal 212, and a shield 214 enclosing a reaction zone 218. A lift mechanism 216 is coupled to the pedestal 212 to position the pedestal 212 relative to the target 210.

A substrate 220 is supported within the chamber 202 by the pedestal 212, and is generally disposed a certain distance from the target 210. The pedestal 212 may be moved along a range of vertical motion within the chamber 202 by the lift mechanism 216. A resistive heater 236 which is connected to a heater power supply 234 can be used to maintain the substrate 220 at a desired process temperature. For processes requiring lower temperature, a chiller 238, which is attached to the pedestal 212, can be used for cooling the pedestal 212 to a desired operating temperature.

Although the target 210 may comprise, as a material to be deposited, an insulator or semiconductor, the target 210 generally comprises a metal—e.g., titanium (Ti), tantalum (Ta) tungsten (W), aluminum (Al), copper (Cu), nickel (Ni), among others. Alternatively, the target 210 may also comprise several components for deposition of a multi-component film. The target 210 is coupled to a target power source 208.

The target power source 208 may comprise a DC source, a radio frequency (RF) source or a DC-pulsed source. When power is applied to the target 210, a plasma is formed from the process gas in the reaction zone 218, comprising ions, electrons and neutral atoms. If the target power source 208 is DC or DC-pulsed, then the target 210 acts as a negatively biased cathode and the shield 214 is a grounded anode. If the target power source 208 is an RF source, then the shield 214 is typically grounded and the voltage at the target 210 varies relative to the shield 214 at a radio frequency, typically 13.56 MHz. In this case, electrons in the plasma accumulate at the target 210 to create a self-bias voltage that negatively biases the target 210.

The electric field accelerates the process gas ions toward the target 210 for sputtering target particles from the target 210. These target particles may also become ionized in the plasma. This configuration enables deposition of sputtered and ionized target particles from the target 210 onto the substrate 220 to form a film 222. The shield 214 confines the sputtered particles and plasma gas in a reaction zone 218 within the chamber 202, and prevents undesirable deposition of target materials beneath the pedestal 212 or behind the target 210.

During sputter deposition, an inert gas, such as argon (Ar), xenon (Xe), neon (Ne), or some other inert gas, is introduced into the vacuum chamber 202. The chamber pressure is controlled by the pumping system 206. For example, a plasma is generated from the inert gas by applying a DC bias of about 100–24,000 W, and more typically about 100–10,000 W, to the sputtering target 210. Target materials are sputtered from the target by the plasma, and deposited on the substrate 220.

The PVD chamber 104 may comprise additional components for improving the sputtering deposition process. For example, a power source 224 may be coupled to the pedestal 212 for biasing the substrate 220, in order to control the deposition of the film 222 on the substrate 220. The power source 224 is typically an AC source having a frequency of, for example, about 400 kHz, or between about 350 to about 450 kHz. When the bias power source 224 is applied, a negative DC offset is created (due to electron accumulation) at the substrate 220 and the pedestal 212. The negative bias at the substrate 220 attracts sputtered target material that becomes ionized. The target material is generally attracted to the substrate 220 in a direction that is substantially orthogonal to the substrate 220. As such, the bias power source 224 improves the step coverage of deposited material compared to an unbiased substrate 220.

The PVD chamber 104 may also comprise a magnet 226 or magnetic sub-assembly positioned behind the target 210 for creating a magnetic field proximate to the target 210. In addition, a coil 230 may be proximately disposed within the shield 214, between the target 210 and the substrate 212. The coil 230 may comprise either a single-turn coil or multi-turn coil that, when energized, helps generate and maintain the plasma between the target 210 and the substrate 211. The process is known as Ion Metal Plasma (IMP) deposition. The coil 230 is generally connected to an AC source 232 having a frequency of, for example, about 2 MHz. Details of a VECTRA IMP chamber have been disclosed in commonly-assigned U.S. patent application, entitled "IMP Technology with Heavy Gas Sputtering", Ser. No. 09/430,998, filed on Nov. 1, 1999, which is herein incorporated by reference.

Embodiments of the invention may also be practiced by another PVD technique involving a self-ionized plasma (SIP). In the SIP process, a plasma is initially ignited using an inert gas such as argon. After plasma ignition, the inert gas flow is terminated, and the deposition plasma is maintained by ions generated from the sputtering target. This self-ionized deposition plasma can be sustained when a sufficient number of atoms sputtered from the target are ionized, and attracted back to the target at sufficiently high energy to serve as the sputtering ions in place of the more typical argon ions. Such a process can be performed in a SIPT™ PVD chamber, which is available from Applied Materials, Inc., of Santa Clara, Calif.

Figure 9:
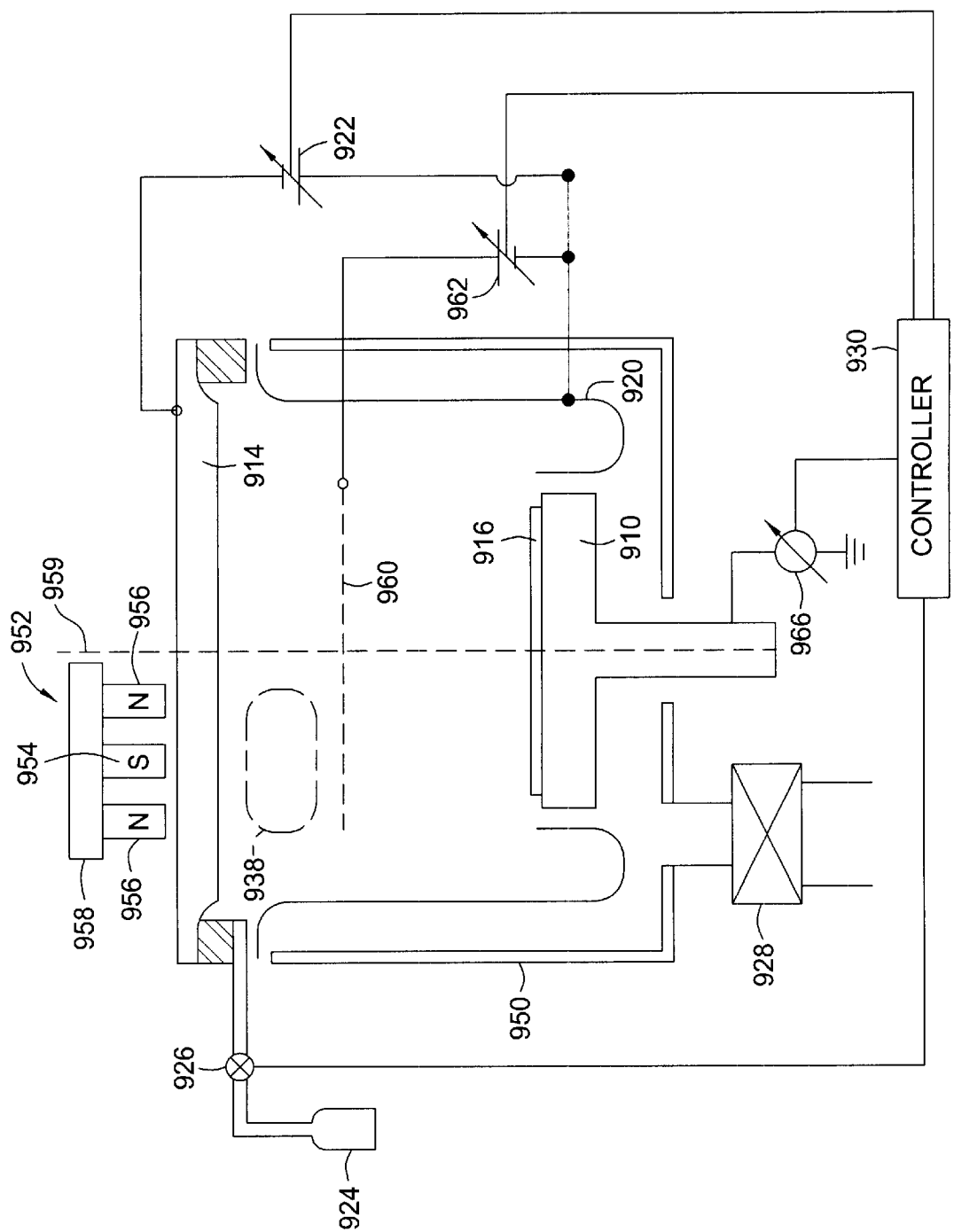
FIG. 9 is a schematic representation of another physical vapor deposition chamber suitable for practicing embodiments of the invention.

FIG. 9 is a schematic representation of a similar chamber that has been disclosed in commonly-assigned copending U.S. patent application Ser. No. 08/854,008, entitled "Sustained Self-Sputtering Reactor Having an Increased Density Plasma", filed May 8, 1997, which is incorporated herein by reference. Many of the components of the chamber 950 are similar to a conventional PVD chamber, e.g., a DC power supply 922 for biasing a target 914, a mass flow controller 926 for controlling the supply of a working gas from a gas source 924, and a shield 920 for protecting the walls of the chamber 950 from sputtered materials, among others. However, there are several features that provide additional process improvements. These features include, for example, a reduced-size magnetron 952, a grid electrode 960, and a pedestal 918 that can be biased relative to the grid 960.

The reduced-size magnetron 952, which has a smaller size compared to that used in a conventional PVD chamber, may comprise a button magnet 954 of one polarity and an annular magnet 956 of the other polarity facing the back of the target 914. A magnetic yoke 958 on the back of the magnets 954, 956 confines the magnetic field. With the reduced-size magnetron 952, the threshold power levels required to maintain a self-ionized plasma may be reduced. The magnetron 952 may further be positioned away from a central axis 959 of the chamber 950, and be circularly scanned about the axis 959 to improve the uniformity of the sputter deposition.

The grid electrode 960, which is positioned between the target 914 and the pedestal 918, may be grounded to serve as an anode, or may be electrically biased, preferably positively, by a variable DC power supply 962, or alternatively, may be RF biased to increase the plasma density. However, it is believed that grounding the grid 960 is sufficient for many applications. The grid electrode 960 is preferably positioned close enough to the target 914 to effectively act as an anode, i.e., to provide a planar geometry to prevent plasma spreading to the shield 920 (thus reducing loss of sputtered ions), yet not close enough to interfere with the electron trajectories in the high density plasma 938. As such, the grid electrode 960 can provide both an increased plasma density as well as additional controls over ion transport.

In this chamber, the pedestal 918 in the chamber 950 may be electrically biased, particularly with respect to the grid 960, by a selectable power supply 966, which may be a DC power supply, an RF power supply, or a combination. This pedestal biasing can be performed relatively independently of the electrical biasing conditions required for generating the plasma and increasing the plasma ion density. Hence, the pedestal bias can be more freely optimized for highly directional deposition (e.g., for filing high aspect ratio features such as contacts, vias or trenches) and other processing characteristics.

CVD Chamber

Figure 8:
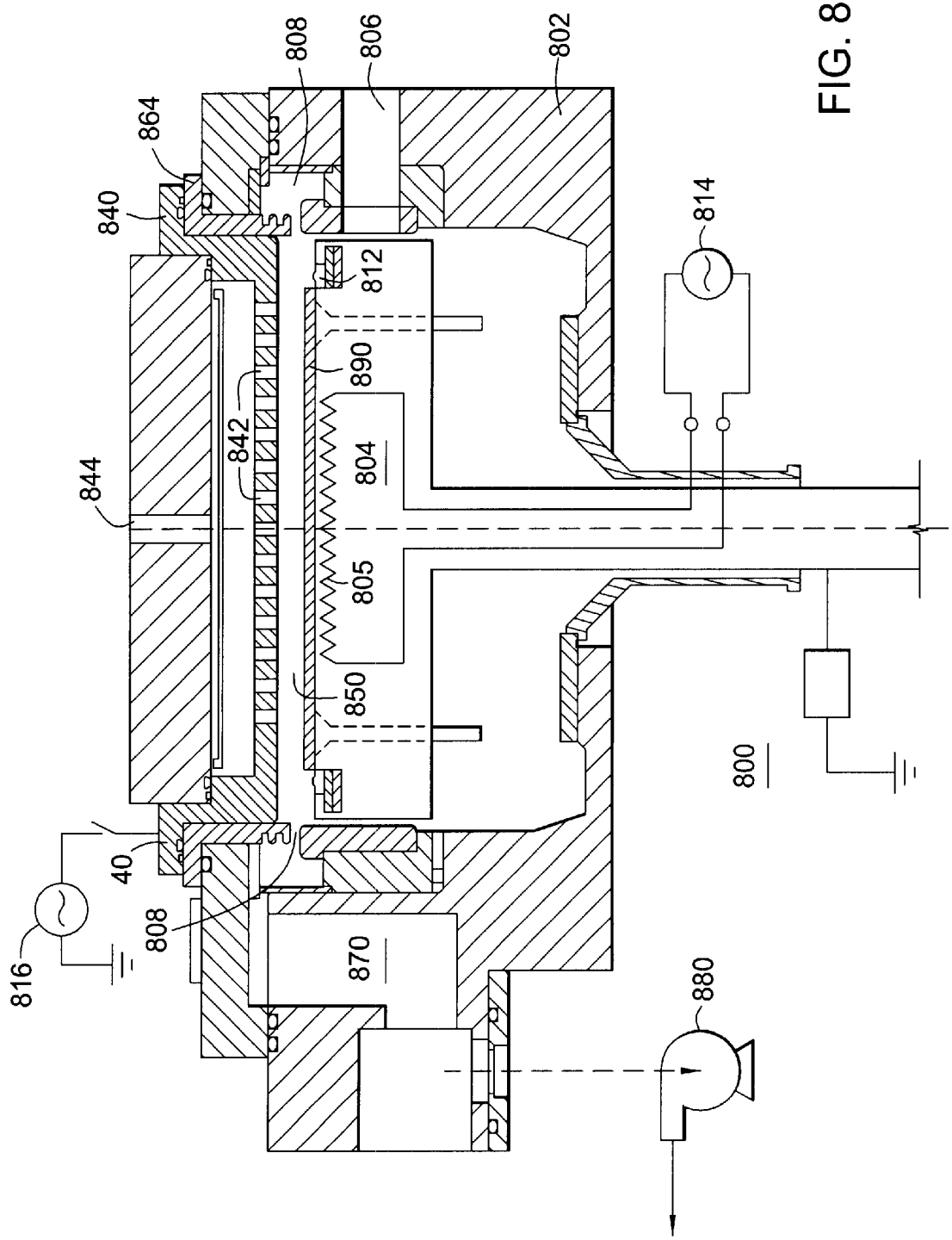
FIG. 8 is a schematic representation of a chemical vapor deposition chamber suitable for practicing embodiments of the invention.

FIG. 8 illustrates a schematic cross-sectional view of a CVD plasma chamber suitable for performing a process of the invention. Details of such a CVD chamber have been disclosed, for example, in commonly-assigned U.S. Pat. No. 5,846,332, entitled "Thermally Floating Pedestal Collar in a Chemical Vapor Deposition Chamber", issued Dec. 8, 1998, and commonly-assigned U.S. Pat. No. 5,993,916, entitled "Method for Substrate Processing with Improved Throughput and Yield", issued Nov. 30, 1999, both of which are incorporated herein by reference. The CVD chamber 800 is adapted for operation in a reduced pressure environment through connection to a vacuum pump 880 via a pumping channel 808. The chamber 800 comprises a chamber body 802 and a pedestal 804 that supports a substrate 890 to be processed. The substrate 890 is transferred in and out of the chamber 800 through a slit valve 806, and is centered on the pedestal 802 by a centering ring 812. A suitable robotics transfer assembly, such as is described in commonly-assigned U.S. Pat. No. 4,951,601, entitled "Multi-chamber Integrated Process System", issued on Aug. 28, 1990, the complete disclosure of which is incorporated herein by reference, transfers substrates into and out of the system.

During processing, the substrate 890 is placed in close proximity to a gas distribution faceplate, or a showerhead 840, which includes a larger number of passageways 842 to allow the flow of a process gas from a gas inlet 844 into a processing zone 850 inside the chamber 800. Film deposition occurs on the surface of the substrate 890 when the process gas reacts at the heated substrate 890. Any excess process gas and byproducts are subsequently pumped out of the chamber 800 through an annular pumping channel 808, which is connected to a pumping plenum 870.

The CVD chamber 800 of FIG. 8 can be operated in two modes, thermal and plasma-enhanced. In the thermal mode, an electrical power source 814 supplies power to a resistive heater 805 of the pedestal 804. The pedestal 802, and thus the substrate 890, are maintained at an elevated temperature sufficient to thermally activate the CVD reaction. In the plasma-enhanced mode, RF power from an RF source 816 is applied to the showerhead 840, which acts as an upper electrode. The showerhead 840 is electrically insulated from the rest of the chamber 800 by the annular isolator ring 864, typically made of an electrically non-conductive ceramic. Sufficient voltage and power is applied by the RF source 816 to generate a plasma from the process gases within the processing region 850. The chamber 800 is designed to minimize undesirable deposition upon various chamber components—e.g., the centering ring 812 is maintained at a lower temperature than the pedestal 804, such that film deposition on the centering ring can be minimized.

The CVD chamber 800 can be used for either thermal or plasma enhanced CVD processes with different precursor gases, including metallo-organic precursors (e.g., tetrakis-(dialkylamino) titanium compounds) or titanium tetrahalides.

A metallo-organic precursor, for example, tetrakis-(dimethylamino) titanium, $Ti(N(CH_3)_2)_4$, or TDMAT, is injected into the chamber 800 through the showerhead 840. The chamber pressure is maintained within a range of about 0.01 Torr to about 50 Torr, while the pedestal 804 maintains the substrate 890 at a temperature of at least about 100° C., or preferably about 300° C.–500° C. Thermal decomposition of TDMAT results in the deposition of a conductive and conformal TiN layer upon a substrate 890.

Process

Figure 3:
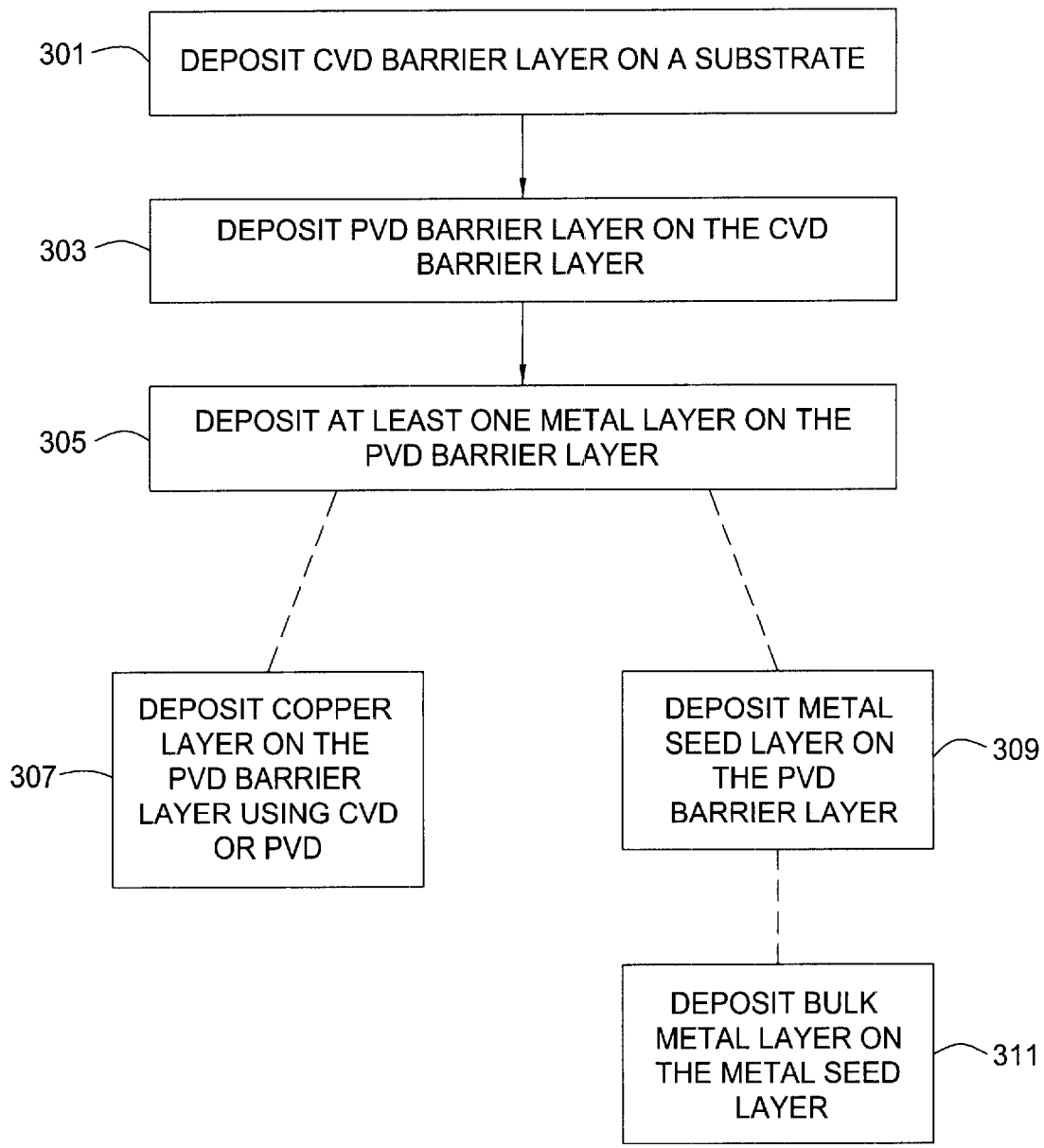
FIG. 3 is a process flow diagram incorporating embodiments of the invention.

FIG. 3 is a process flow diagram illustrating a method of metallization incorporating embodiments of the invention. The process sequence can be implemented in a multi-chamber system comprising both CVD and PVD chambers. In step 301, a first barrier layer is deposited on a substrate using, for example, CVD. The substrate may comprise a structure having an opening such as a contact, via or trench formed in an insulating layer. The opening may extend through the insulating layer to an underlying conductive or semiconductive layer to allow a metal contact to be formed. The first barrier layer may be a metal, metal nitride or ternary nitride, such as Ti, Ta, W, TiN, TaN, WN or TiSiN. Depending on the particular applications or technologies, different thicknesses may be used for the first barrier layer. For example, for sub-0.35 μm applications, a thickness of less than about 300 Å may be appropriate, e.g., between about 25 and about 100 Å, preferably about 50 Å. Typically, the thickness of the CVD barrier layer should be sufficient to provide adequate barrier protection along the sidewall of the opening.

According to embodiments of the invention, a second barrier layer is then deposited on the first barrier layer, as shown in step 303. The second barrier layer may be a metal or metal nitride, e.g., Ta, TaN, Ti, TiN, W or WN, or a ternary nitride, deposited using PVD. Different PVD techniques such as standard sputtering, IMP or SIP may be used. The second barrier layer and the first barrier layer form a bilayer barrier stack that is effective in preventing metal diffusion from a subsequently deposited metal layer to the underlying conductive or semiconductive layer, or to the insulating layer. The thickness required for the second barrier layer may depend on the thickness of the first barrier layer. For example, if a thicker first barrier layer is used, a thinner second barrier layer may suffice. In general, a second barrier layer having a thickness range between about 25 and about 300 Å may be used, preferably about 100 Å. For example, a second barrier layer with a thickness of about 100 Å may be used with a first barrier layer having a thickness of about 50 Å. Depending on the particular applications or technologies, other thicknesses may also be used.

In step 305, at least one metal layer is formed on the second barrier layer. In general, the metal layer may be formed by various deposition techniques such as PVD or CVD. The metal layer is preferably deposited on the second barrier layer in-situ, i.e., in the same integrated processing system, or without exposing the second barrier layer to atmosphere. As such, undesirable contamination of the barrier and metal layer interface can be avoided.

In one embodiment, the metal layer is a copper (Cu) layer, which can be deposited to different thicknesses using CVD or PVD, as illustrated in step 307. The Cu layer may have a thickness that is at least sufficient to fill the opening (e.g., contact, via or trench) in the substrate.

Another embodiment is illustrated by steps 309 and 311. In step 309, a metal seed layer, e.g., Cu, is deposited on the second barrier layer using PVD, such as IMP or SIP. The metal seed layer is used to facilitate a subsequent formation of a bulk metal layer. A thickness between about 100 and about 2000 Å may be used for the metal seed layer. In one example, the Cu seed layer is deposited on a PVD barrier layer, e.g., Ta or TaN. The resulting Cu seed layer exhibits enhanced (111) orientation compared to that of a Cu layer formed on a CVD barrier layer. Furthermore, the PVD Ta or TaN layer provides a good interface with the Cu seed layer, resulting in minimal copper agglomeration. In step 311, another copper layer (or more generally, a bulk metal layer) is deposited on the PVD copper seed layer. This copper layer is often deposited using electroplating (ECP), which allows the copper bulk layer to be formed at a relatively high deposition rate compared to other techniques such as CVD or PVD. For example, a thickness of about 10,000 Å is commonly used for most current applications, although other thicknesses may also be used as appropriate to the device structure.

Thereafter, the substrate containing the copper and barrier structure may be subjected to further processing steps (not shown). These subsequent processing steps may include, for example, chemical mechanical polishing (CMP) which is used to form a planarized metal plug inside the opening.

Figure 4A:
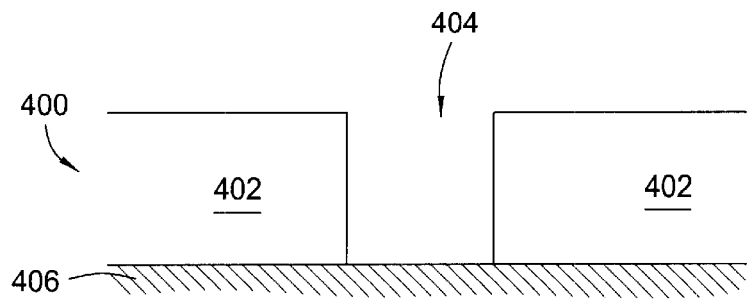
FIGS. 4a–e are schematic partial sectional views of a substrate undergoing metallization processing.

FIGS. 4a–e are schematic partial sectional views of a substrate at different stages of metallization processing according to one embodiment illustrated in FIG. 3. FIG. 4a shows a substrate 400 having an opening 404 formed on an insulating layer 402 that has been deposited on an underlying conductive or semiconductive layer 406. The word "substrate" generally refers to any workpiece such as a semiconductor wafer, which may also comprise other material layers formed thereon. The opening 404 may be a contact, via or trench extending to the surface of the conductive or semiconductive layer 406, and the layer 406 may comprise silicon, polysilicon, copper, tungsten, conductive silicides, among others.

Figure 4B:
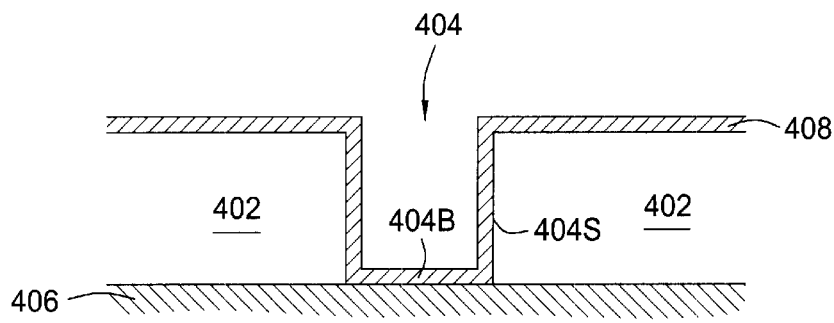

FIG. 4b shows the deposition of a first barrier layer 408 using CVD. The first barrier layer 408 may be a metal such as Ti, Ta, W, or a conductive nitride such as TiN, TaN, WN or TiSiN, among others. The deposition may be performed in a variety of CVD chambers using, for example, thermal or plasma enhanced processes. As an example, a TxZ CVD chamber, which is available from Applied Materials, Inc., of Santa Clara, Calif., is suitable for depositing the first barrier layer 408. As illustrated in FIG. 4b, the use of CVD allows conformal deposition of the first barrier layer 408, offering good step coverage both on the sidewalls 404S and at the bottom 404B of the opening 404. The formation of the first barrier layer 408 by CVD is well suited to submicron applications with high aspect ratio features, because adequate step coverage on the sidewalls 404S is necessary to avoid undesirable metal diffusion into the insulating layer 402.

In one illustrative embodiment, a TiN barrier layer is deposited from a Ti-containing precursor, such as tetrakis-dimethyl-amidotitanium (TDMAT), or other organometallic compounds. The deposition is performed in a TxZ chamber, with TDMAT being introduced into the chamber by an inert carrier gas, e.g., helium (He), at a flow rate of about 375 sccm. The TiN barrier layer is deposited on the substrate 400 at a pressure of about 5 Torr and a temperature of about 380° C. by thermal decomposition of TDMAT. The process parameters cited herein are meant to be illustrative, and may be adjusted as appropriate to suit other applications, process chambers and substrates of different configurations and dimensions.

A plasma treatment step is typically used to treat the TiN film following deposition. The plasma treatment may be performed in-situ, without removing the substrate from the TxZ chamber. For example, a treatment plasma may be generated from a mixture of nitrogen ($N_2$) at a flow rate of about 300 sccm and hydrogen ($H_2$) at a flow rate of about 450 sccm, by applying a radio-frequency (RF) power of about 750 W to an electrode in the TxZ chamber. The plasma treatment is typically performed at a pressure of about 1.3 Torr and a temperature of about 380° C. The plasma treatment may be used, for example, to reduce the resistivity of the deposited film. In one embodiment, a film resistivity of about 300 $\mu\Omega$-cm can be achieved for a 50 Å thick film after plasma treatment. It is understood that other metal nitrides may also be deposited as the first barrier layer 408 using a variety of CVD techniques. For example, a ternary nitride such as TiSiN may be formed by first depositing a TiN layer, and then treating the TiN layer in a silicon-containing environment (e.g., silane) to allow formation of TiSiN. Alternatively, silane may be added to the other Ti-containing gas mixtures for TiSiN formation.

Figure 4C:
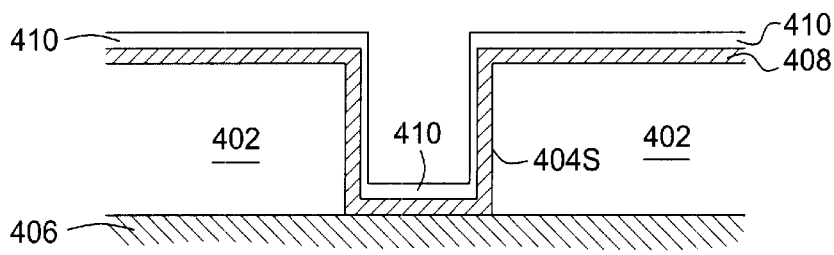

After the formation of the CVD barrier layer 408, a second barrier layer 410 is formed, as shown in FIG. 4c. According to embodiments of the invention, the second barrier layer 410 is formed by a PVD technique, e.g., standard sputtering, IMP or SIP, which can be performed in a variety of PVD chambers such as those available from Applied Materials, Inc., of Santa Clara, Calif. The second barrier layer 410 typically comprises a metal or metal nitride, such as Ta, TaN, Ti, TiN, W, WN, or ternary nitride such as TiSiN, among others. Despite the relatively thin second barrier layer 410 formed on the sidewalls 404S of the opening 404 (due to the non-conformal nature of existing PVD techniques), metal diffusion at the sidewalls can still be effectively prevented by the barrier structure of the invention, due to the presence of the conformal first barrier layer 408.

In one embodiment, a Ta or TaN layer is deposited to a thickness between about 25 and about 300 Å, preferably about 100 Å over the first barrier layer 408. The Ta or TaN barrier layer may be deposited using appropriate target materials and process gases with process conditions that are known in the art. For Ta deposition using IMP, an inert gas (e.g., argon) is introduced into an IMP chamber at a flow rate of about 35 sccm, and a pressure of about 35 mTorr. The deposition is preferably performed in two separate stages. In a first deposition stage, a plasma is generated by applying a DC power of about 1000 W, to a Ta target, along with a RF power of about 1500 W, applied to a coil of the IMP chamber. The substrate temperature may be maintained at less than about 100° C., including for example, room temperature or sub-zero temperatures. Deposition of Ta proceeds for a few seconds during this first stage without any bias on the substrate. In a second deposition stage, an AC bias power of about 350 W, is applied to the substrate, with the other parameters being the same as in the first deposition stage. The time duration of the second deposition stage is usually the same as that of the first deposition stage. For example, to obtain a Ta layer with a thickness of about 100 Å, a deposition time of about 3 to 5 seconds may be used in the respective deposition stages. The two-stage deposition procedure is used to optimize uniformity in the deposited Ta layer. In other embodiments, the Ta layer 410 may also be formed in a single stage deposition, e.g., either with or without AC biasing of the substrate, or perhaps multiple stage deposition with different combinations of substrate biasing. It is understood that the process parameters disclosed herein are meant to be illustrative—e.g., suitable for processing substrates having diameters of about 200 mm. Since process parameters tend to be hardware dependent, they may be adjusted as appropriate for other process applications, chamber configurations and/or substrate dimensions.

Alternatively, TaN may be deposited as the second barrier layer 410 using IMP. For example, a process gas mixture comprising an inert gas and nitrogen ($N_2$) is typically used, with the $N_2$ gas reacting with sputtered Ta to produce TaN. In one embodiment, the TaN layer is deposited in different stages. During a first stage, an Ar flow rate is established at about 56 sccm, along with a $N_2$ flow rate of about 35 sccm. The chamber pressure is maintained at about 35 mTorr. A plasma is generated from the process gas mixture by applying a DC power of about 1000 W, to the Ta target, while a RF power of about 2500 W, is applied to the coil in the IMP chamber. With the substrate maintained at a temperature of about 100° C. or below, e.g., including room temperature or sub-zero temperatures, a TaN layer is deposited on the substrate, without any substrate bias. During a second deposition stage, the substrate is biased with an AC power of about 400 W, while other process parameters are maintained at the same settings as in the first step. After completion of the TaN deposition in the second stage, the $N_2$ flow is terminated, while the AC bias and the DC and the RF powers are maintained for about 2 seconds in a subsequent third stage. During this third stage, the surface of the TaN layer is modified to be Ta-rich due to the absence of $N_2$ flow. It has been found that by forming a Ta-rich surface for the TaN layer, good contact resistance can be achieved between the barrier layer and a subsequently deposited metal layer. It is understood that this three-stage TaN deposition is meant to be illustrative, and other TaN deposition sequences may be used in forming the second barrier layer 410. Furthermore, various process parameters may also be adjusted as appropriate to suit different application needs, process chamber configurations and/or substrate dimensions.

After the formation of the second barrier layer 410, a metal layer 412 is then formed, as shown in FIG. 4c. According to one embodiment of the invention, the metal layer 412 is a copper (Cu) seed layer formed by PVD (e.g., IMP or SIP), and is typically deposited to a thickness between about 100 and about 2000 Å. Different PVD chambers may be used for the formation of Cu seed layer 412, using process parameters that are known in the art. In one exemplary embodiment using a SIP chamber, a plasma is first ignited from an Ar flow, with a DC power of about 6000 W applied to a Cu target. Once the plasma is generated, the Ar flow is terminated, and the DC power is increased to about 24,000 W, or between about 500 and about 30,000 W. Unlike the IMP process, the plasma is sustained by the copper ions themselves (hence the name "self ionized plasma"), without the need of a RF power applied to a coil. Typically, an AC power of about 175 W is also used to bias the substrate, which is maintained at about room temperature or below, e.g., 20° C. or sub-zero temperatures. Deposition uniformity and step coverage are improved by the bias applied to the substrate.

When the copper seed layer 412 is deposited by PVD on the PVD Ta or TaN layer 410, the resulting copper layer 412 exhibits good (111) orientation with enhanced grain growth compared to a copper layer deposited on a CVD barrier layer. The (111) orientation is important for long-term reliability against electromigration and stress migration. The enhancement of the (111) orientation in the Cu layer 412 by the TaN PVD layer 410 (compared to a Cu layer on a CVD TiN layer) can be illustrated by two X-Ray diffraction (XRD) spectra shown in FIGS. 5 and 6.

Figure 5:
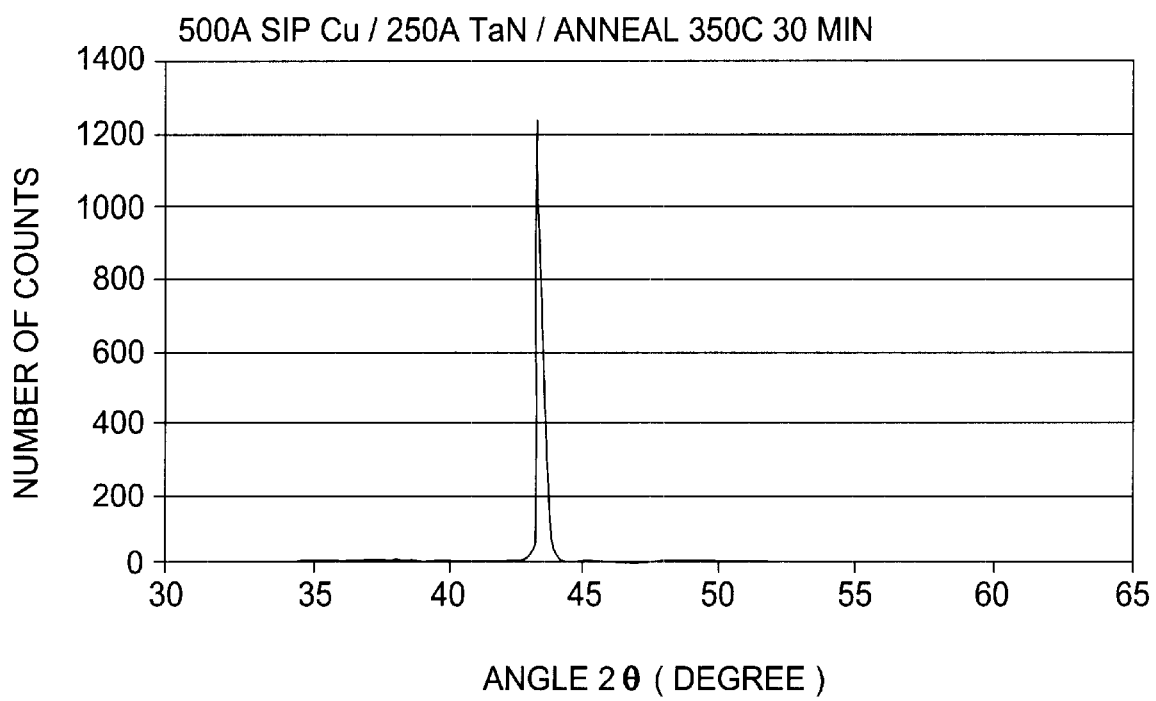
FIG. 5 is an X-ray diffraction spectrum for a copper layer deposited on a tantalum nitride layer formed by physical vapor deposition.

FIG. 5 shows an XRD spectrum of a 500 Å Cu layer deposited on a PVD TaN layer with a thickness of about 250 Å. The Cu/TaN layer structure of FIG. 5 has been annealed for about 30 minutes at about 350° C. in an inert atmosphere. The XRD spectrum shows a strong peak (e.g., about 1200 counts) at an angle of about 44 degrees, which is indicative of the (111) orientation. Although the Cu layer of FIG. 5 is deposited by SIP, other PVD techniques may also be used, since the enhancement of the (111) orientation is relatively independent of the specific PVD technique used to form the Cu layer.

Figure 6:
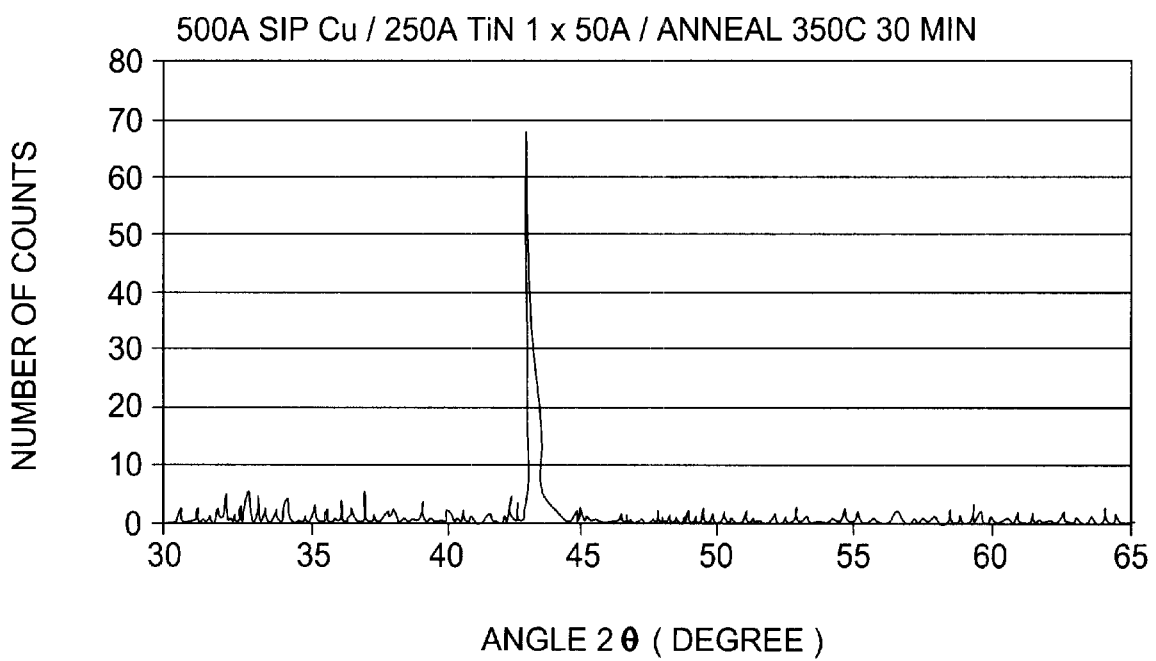
FIG. 6 is an X-ray diffraction spectrum for a copper layer deposited on a titanium nitride layer formed by chemical vapor deposition.

The enhancement of the Cu (111) orientation is further illustrated by comparing the XRD spectrum of FIG. 5 with that shown in FIG. 6. FIG. 6 shows an XRD spectrum for a 500 Å Cu layer formed on a CVD TiN layer having a thickness of about 50 Å. Again, the Cu layer is formed by SIP and the Cu/TiN layer structure is subjected to a thermal anneal at about 350° C. for about 30 minutes. The XRD spectrum of FIG. 6 shows a much weaker (111) peak, e.g., about 17 times weaker than that obtained for the Cu layer deposited on the PVD TaN layer. It is noted that a PVD Cu layer formed on a CVD TaN layer yields a similar result, i.e., weak (111) orientation, as that shown in FIG. 6.

Figure 7A:
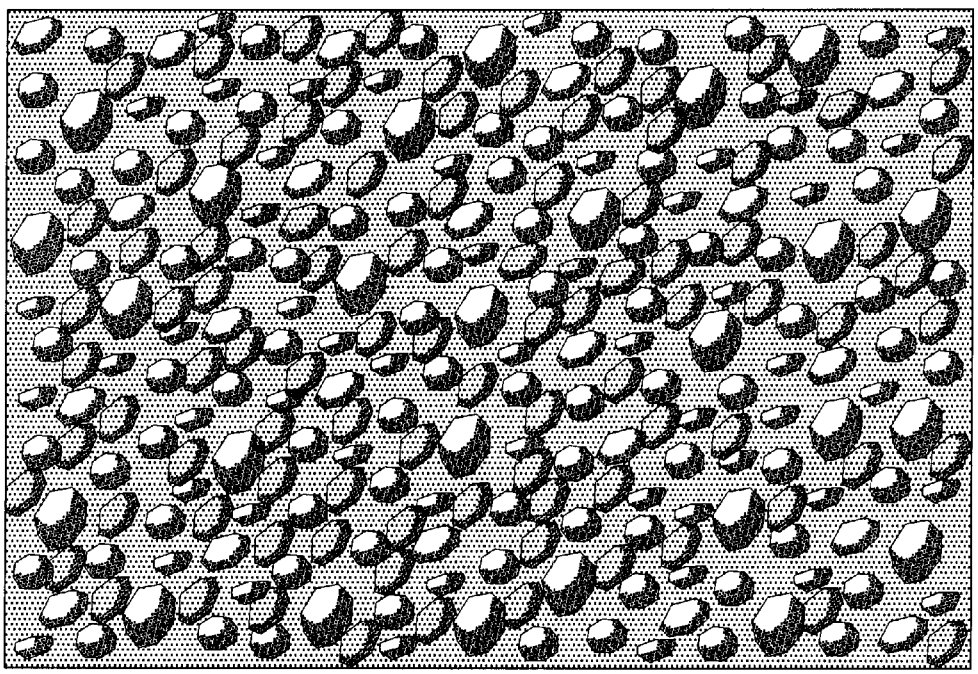
FIGS. 7a–b are scanning electron micrographs of a copper layer deposited on two different substrates.
Figure 7B:
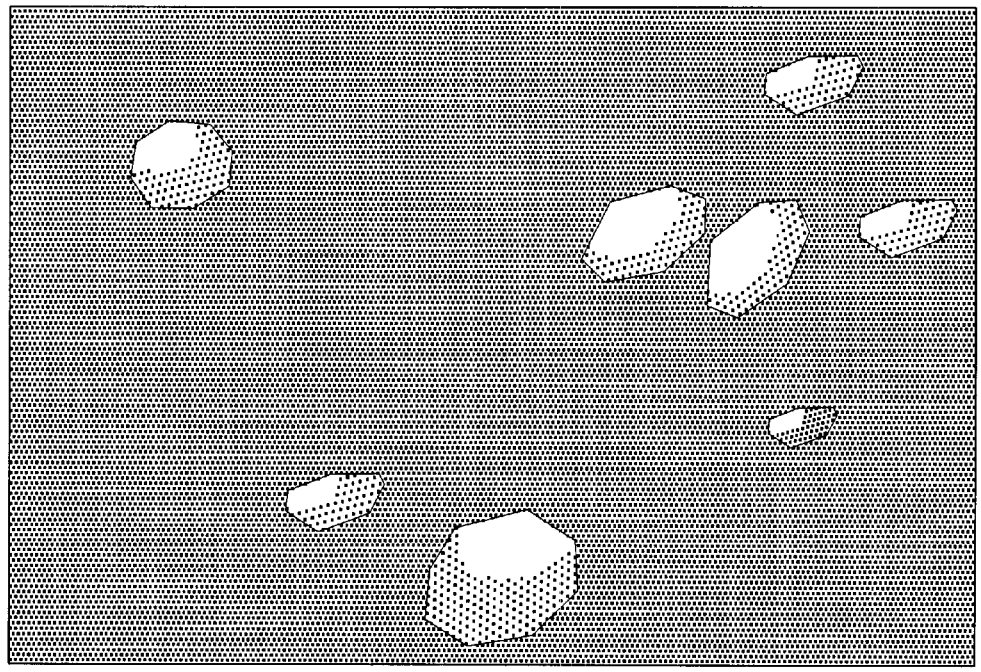

Aside from enhancing the Cu (111) orientation, the PVD Ta barrier layer offers another advantage to copper metallization. For example, the Ta surface provides a good interface for subsequent Cu deposition, allowing the formation of the Cu seed layer with minimal agglomeration, and good adhesion characteristics. This is illustrated in FIGS. 7a–b, which show images obtained from scanning electron microscopy (SEM) for a "dewetting" experiment conducted on two thin Cu layers (about 30 Å) deposited respectively on two different underlying layers. The dewetting experiment involves depositing the Cu layer on an underlying substrate layer, and annealing the substrate in hydrogen ($H_2$) at about 350° C. for about 15 minutes. In an ideal situation, the Cu layer will not exhibit any agglomeration, or delamination, from the underlying layer.

FIG. 7a is a SEM image of an annealed 30 Å Cu layer on an underlying CVD TiN layer with a thickness of about 50 Å. The agglomeration, or formation of small Cu clusters, is readily observable. Such agglomeration is usually undesirable because the non-uniformity of the Cu layer may result in non-uniformity in subsequent electroplating of a Cu bulk layer. Contrast this with FIG. 7b, which shows a SEM image of an annealed 30 Å Cu layer on an underlying barrier bilayer of the present invention. The bilayer consists of a PVD Ta layer (about 50 Å) deposited on a CVD TiN layer with a thickness of about 50 Å. The problem of Cu agglomeration is much improved in this case due to the presence of the PVD Ta/Cu interface.

Figure 4D:
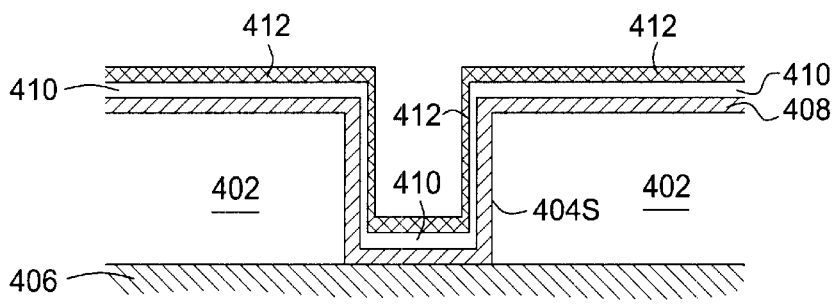
Figure 4E:
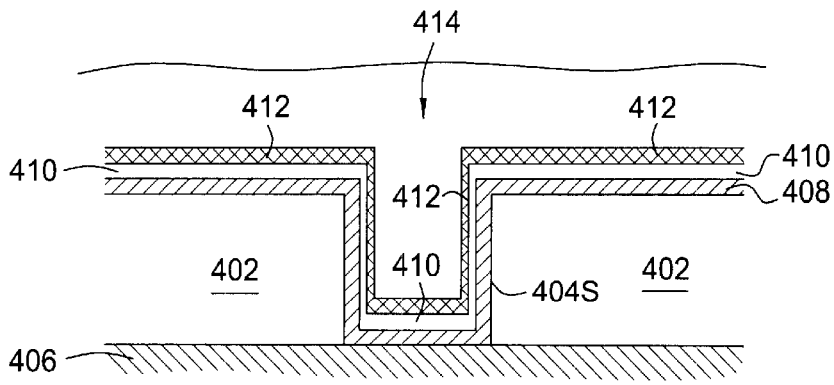

FIG. 4d shows the subsequent deposition of a metal layer 414 (or bulk layer) such as Cu, on the metal seed layer 412. For example, the bulk Cu layer 414 may be formed by electrochemical plating (ECP) in an ELECTRA™ Cu ECP system, or an Electra™ Cu Integrated ECP (iECP™) system, both of which are available from Applied Materials, Inc., of Santa Clara, Calif. For example, the bulk Cu layer 414 may be formed by electroplating from a solution comprising about 0.85M copper sulphate with appropriate additives at a temperature of about 15° C. The additives, known as Electra plate X Rev. 1.0 and Electra plate Y Rev. 1.0, are supplied by Lea Ronal of New York. Due to the preferred (111) orientation of the Cu seed layer 412, the Cu bulk layer 414 is also formed with enhanced (111) orientation, resulting in a Cu metal interconnect with improved resistance against electromigration or stress migration.

Although several preferred embodiments which incorporate the teachings of the present invention have been shown and described in detail, those skilled in the art can readily devise many other varied embodiments that still incorporate these teachings. For example, the CVD and PVD processes disclosed herein are primarily for illustrative purposes. It is understood that embodiments of the invention may be practiced using a variety of CVD and PVD process conditions in different chambers.

What is claimed is:

1. A method of copper metallization, comprising:
   depositing a refectory metal barrier layer by chemical vapor deposition;
   depositing a refractory metal nitride barrier layer by physical vapor deposition on the refectory metal barrier layer;
   depositing a copper seed layer by physical vapor deposition on the refractory metal nitride barrier layer; and then
   depositing a copper layer on the copper seed layer at conditions sufficient to form a (111) crystalline orientation.

2. The method of claim 1, wherein the refectory metal barrier layer comprises one or more metals selected from the group consisting of titanium, tantalum and tungsten.

3. The method of claim 1, wherein the refectory metal barrier layer has a thickness between about 25 Å and about 100 Å.

4. The method of claim 1, wherein the refractory metal nitride barrier layer comprises a metal selected from the group consisting of tantalum, titanium and tungsten.

5. The method of claim 1, wherein the refractory metal nitride barrier layer is tantalum nitride, titanium nitride, tungsten nitride, titanium silicon nitride, or tantalum silicon nitride.

6. The method of claim 1, wherein the refractory metal nitride barrier layer has a thickness between about 25 Å and about 300 Å.

7. The method of claim 1, wherein the copper seed layer is deposited at conditions sufficient to form a (111) crystalline orientation.

8. A method of copper metallization, comprising:
   depositing a refectory metal barrier layer by chemical vapor deposition;
   depositing a refractory metal nitride barrier layer by physical vapor deposition on the refectory metal barrier layer,
   depositing a copper seed layer by physical vapor deposition on the refractory metal nitride barrier layer at conditions sufficient to form a (111) crystalline orientation; and then
   depositing a copper layer on the copper seed at conditions sufficient to form a (111) crystalline orientation.

* * * * *

UNITED STATES PATENT AND TRADEMARK OFFICE
CERTIFICATE OF CORRECTION

PATENT NO. : 6,562,715 B1 Page 1 of 1
DATED : May 13, 2003
INVENTOR(S) : Chen et al.

It is certified that error appears in the above-identified patent and that said Letters Patent is hereby corrected as shown below:

<u>Column 4,</u>
Line 6, please change "film. 222." to -- film 222. --.
Line 62, please change "SIPT$^{TM}$" to -- SIP$^{TM}$ --.

Signed and Sealed this

Thirteenth Day of January, 2004

JON W. DUDAS
*Acting Director of the United States Patent and Trademark Office*